United States Patent [19]

Baldwin

[11] Patent Number: 5,946,791
[45] Date of Patent: *Sep. 7, 1999

[54] METHOD FOR TESTING AND MOUNTING INTEGRATED CIRCUITS ONTO PRINTED CIRCUIT BOARDS

[75] Inventor: Donald D. Baldwin, Boise, Id.

[73] Assignee: Micron Technology, Inc., Boise, Id.

[*] Notice: This patent is subject to a terminal disclaimer.

[21] Appl. No.: 08/899,846

[22] Filed: Jul. 24, 1997

Related U.S. Application Data

[62] Division of application No. 08/516,385, Aug. 17, 1995, which is a division of application No. 08/048,129, Apr. 13, 1993, Pat. No. 5,479,694.

[51] Int. Cl.[6] .............................. H05K 3/34; B23K 31/02; B23P 19/00; G01R 31/00
[52] U.S. Cl. ................................ 29/593; 29/719; 29/741; 29/840; 228/6.2; 228/180.21; 228/212; 324/754
[58] Field of Search ............................. 29/593, 741, 744, 29/840, 719; 228/6.2, 180.21, 180.22, 44.7, 212, 213; 156/272.4, 306.3

[56] References Cited

U.S. PATENT DOCUMENTS 3,612,955 10/1971 Butherus et al. ......................... 29/834
3,937,386 2/1976 Hartleroad et al. ...................... 228/6.2
4,620,663 11/1986 Odashima et al. ................. 228/180.21

Primary Examiner—P. W. Echols
Attorney, Agent, or Firm—Wells, St. John, Roberts, Gregory & Matkin, P.S.

[57] ABSTRACT

An integrated circuit (IC) device is mounted onto a printed circuit board (PCB) by inducing a magnetic field of a selected strength at the surface of the PCB to temporarily hold the IC device onto the PCB. The IC device is provided with magnetic material which is attracted by the magnetic field. The magnetic field is maintained while the IC device and PCB are tested, and then subsequently during soldering when the IC device is permanently bonded to the PCB.

11 Claims, 4 Drawing Sheets

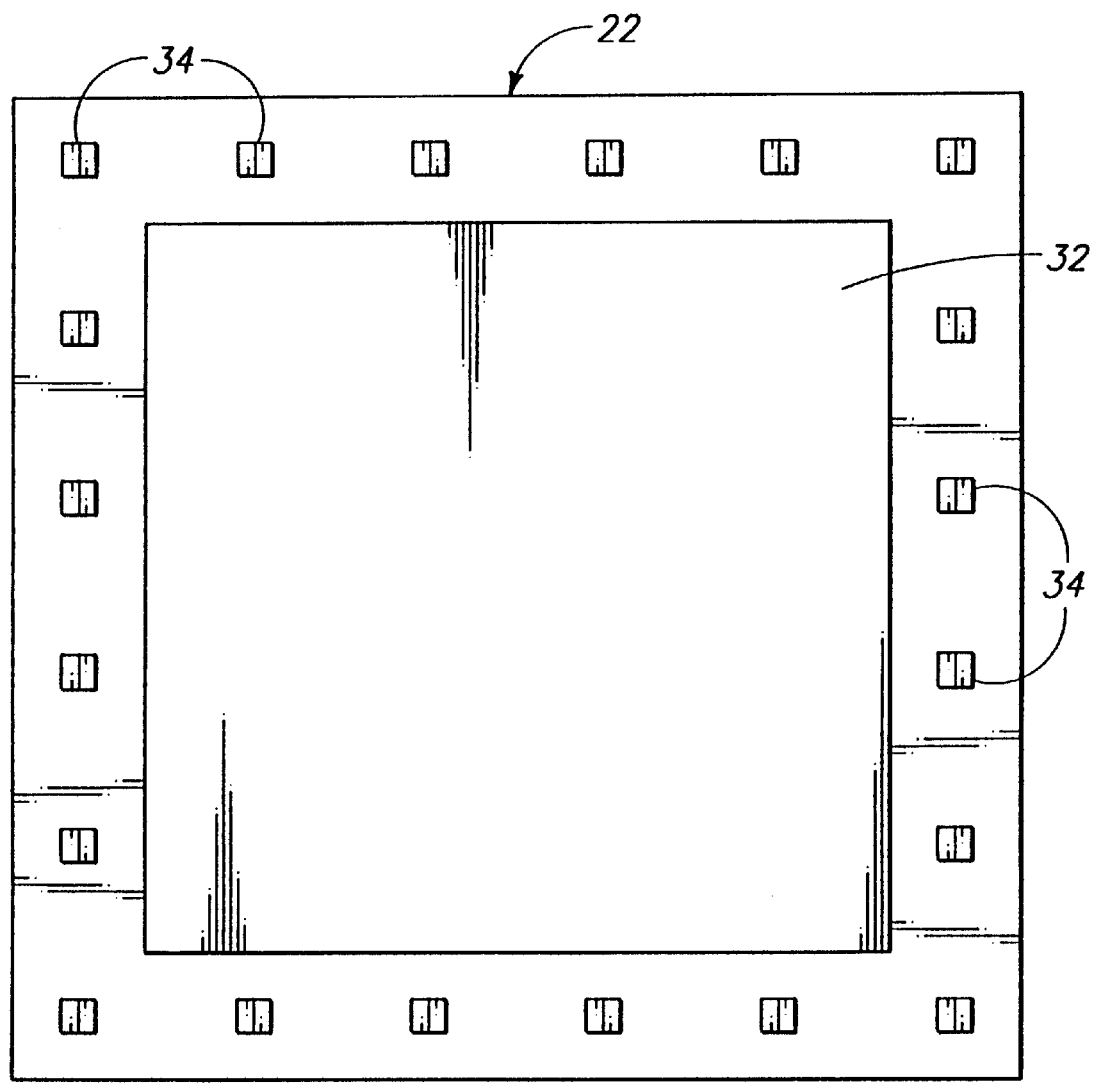

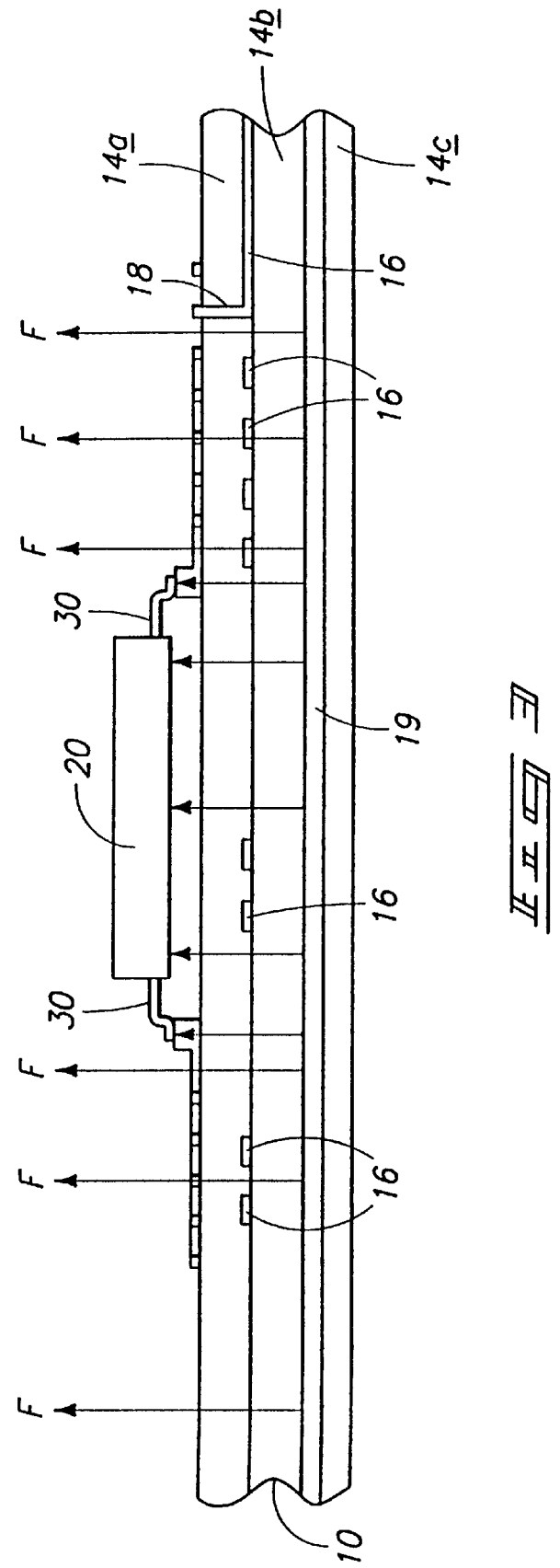

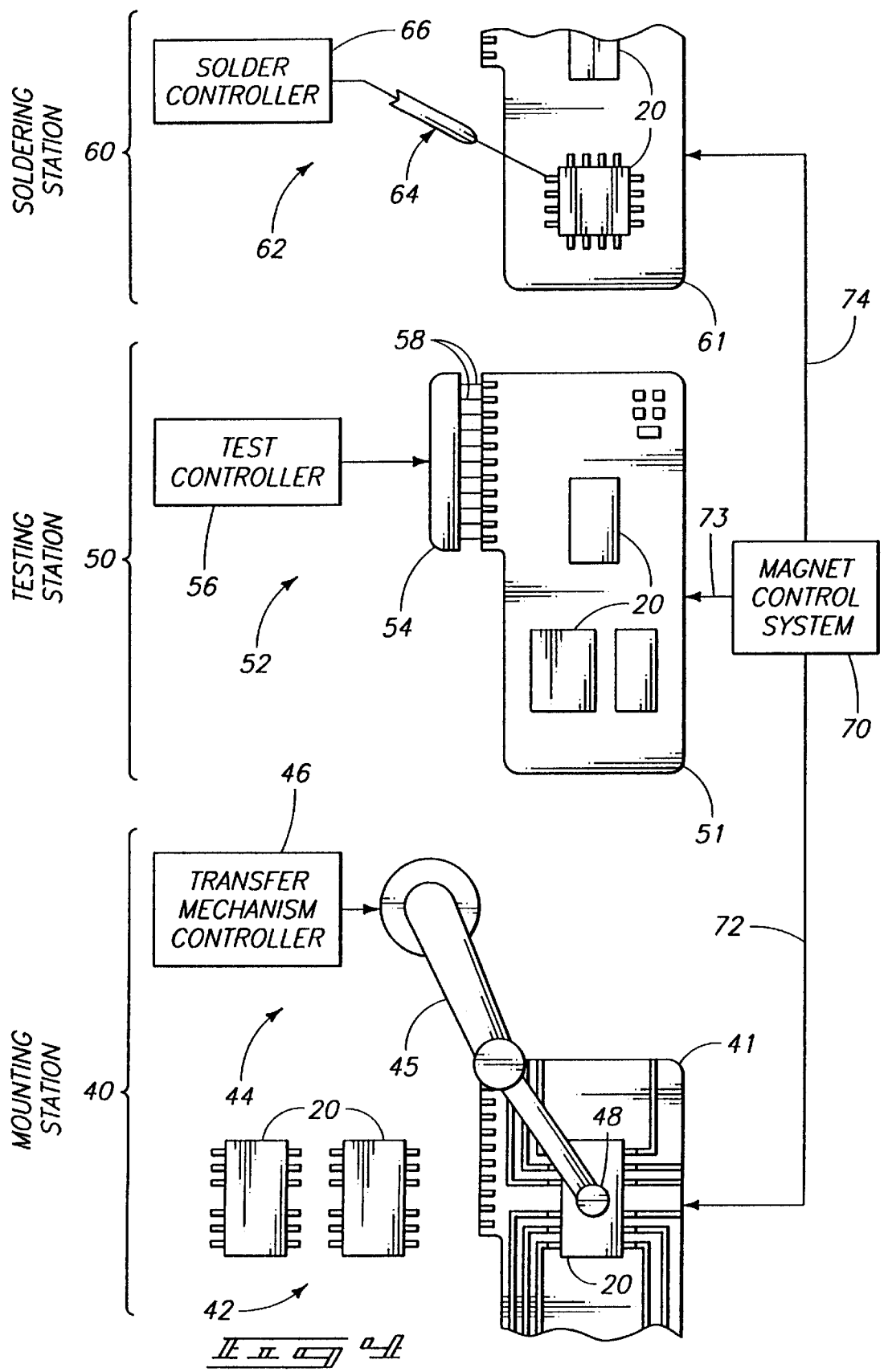

5,946,791

METHOD FOR TESTING AND MOUNTING INTEGRATED CIRCUITS ONTO PRINTED CIRCUIT BOARDS

This is a division of U.S. patent application Ser. No. 08/516,385, filed Aug. 17, 1995, which in turn is a division of application Ser. No. 08/048,129, filed Apr. 13, 1993, now U.S. Pat. No. 5,479,694, issued Jun. 6, 1995.

TECHNICAL FIELD

This invention relates to a system and method for mounting integrated circuits onto printed circuit boards. This invention also relates to a method for testing integrated circuits and printed circuit boards.

BACKGROUND OF THE INVENTION

Electronic circuit boards for computers and other devices typically consist of many integrated circuits mounted on a printed circuit board (PCB). Individual integrated circuit (IC) packages have a semiconductor chip or die enclosed within a protective plastic package. A lead frame consisting of multiple conductive leads provide the electrical interconnect between the enclosed semiconductor chip and components exterior to the plastic package.

The PCB has many conductive traces arranged on its surface according to a selected pattern for efficiently transferring electronic signals across the board to and from individual IC packages. The traces on the PCB have terminal locations or bonding sites which define the locations that specific IC packages are to be located. As the IC package is being mounted to the PCB, the conductive leads of the IC package are aligned with corresponding bonding sites on the PCB. The conductive leads are then soldered to the corresponding bonding sites to permanently mount the IC package to the PCB.

One significant problem in the mounting process is how to initially position the IC packages on the PCB and hold them there temporarily until the soldering step is performed. According to conventional techniques, a screen with multiple holes is positionally and carefully aligned with the PCB so that the screen holes are superimposed on the bonding sites on the PCB. Solder paste is then squirted through the holes of the screen onto the bonding sites of the PCB. Solder paste is a conductive material which forms a temporary glue.

After the solder paste has been applied to the bonding sites, the IC packages are positioned atop the PCB. The solder paste temporarily adheres the conductive leads of the IC package to the corresponding bonding sites. Solder is then applied to the bonding sites, and the PCB is subjected to ultraviolet light or other techniques for causing the solder to melt and completely surround and secure the conductive leads of the IC package to the bonding sites.

The use of solder paste for temporarily mounting IC packages onto PCBs creates numerous problems. First, the process of positioning and aligning the screen over the PCB and squirting the solder paste through the screen holes is a difficult, time-consuming task. Second, the solder paste is an extremely messy substance and can cause problems if not precisely applied. Third, after the permanent solder is applied, the PCBs must be cleaned with special cleaning materials, such as freon-type cleaners, to remove all of the solder paste. Accordingly, the present mounting technique introduces several additional manufacturing steps that reduce overall manufacturing efficiency while increasing costs.

The present invention eliminates the above-mentioned drawbacks by providing a system and method for mounting integrated circuits onto printed circuit boards without the use of solder paste.

Another drawback in conventional manufacturing techniques is that, when an IC package fails during the testing, it is often too difficult to break the solder bonds and remove the defective IC package without damaging the PCB or other components. Thus, the entire manufactured board is discarded, even though most of the board and IC packages are operative. This causes significant waste because otherwise operable components are needlessly thrown away.

The present invention provides a method for testing integrated circuits and printed circuit boards prior to the soldering step. This testing method thereby permits removal of defective components without discarding the operable components.

BRIEF DESCRIPTION OF THE DRAWINGS

Preferred embodiments of the invention are described below with reference to the following accompanying drawings.

FIG. 1 also shows a partial cut away view illustrating a semiconductor chip within the IC package.

FIG. 2 is an enlarged top plan view of the semiconductor chip shown in FIG. 1.

FIG. 3 shows a cross-sectional view taken along line 3—3 in FIG. 1.

FIG. 4 is a diagrammatic illustration of a system and method for mounting integrated circuits onto printed circuit boards according to this invention.

DETAILED DESCRIPTION OF THE PREFERRED EMBODIMENTS

Figure 1:
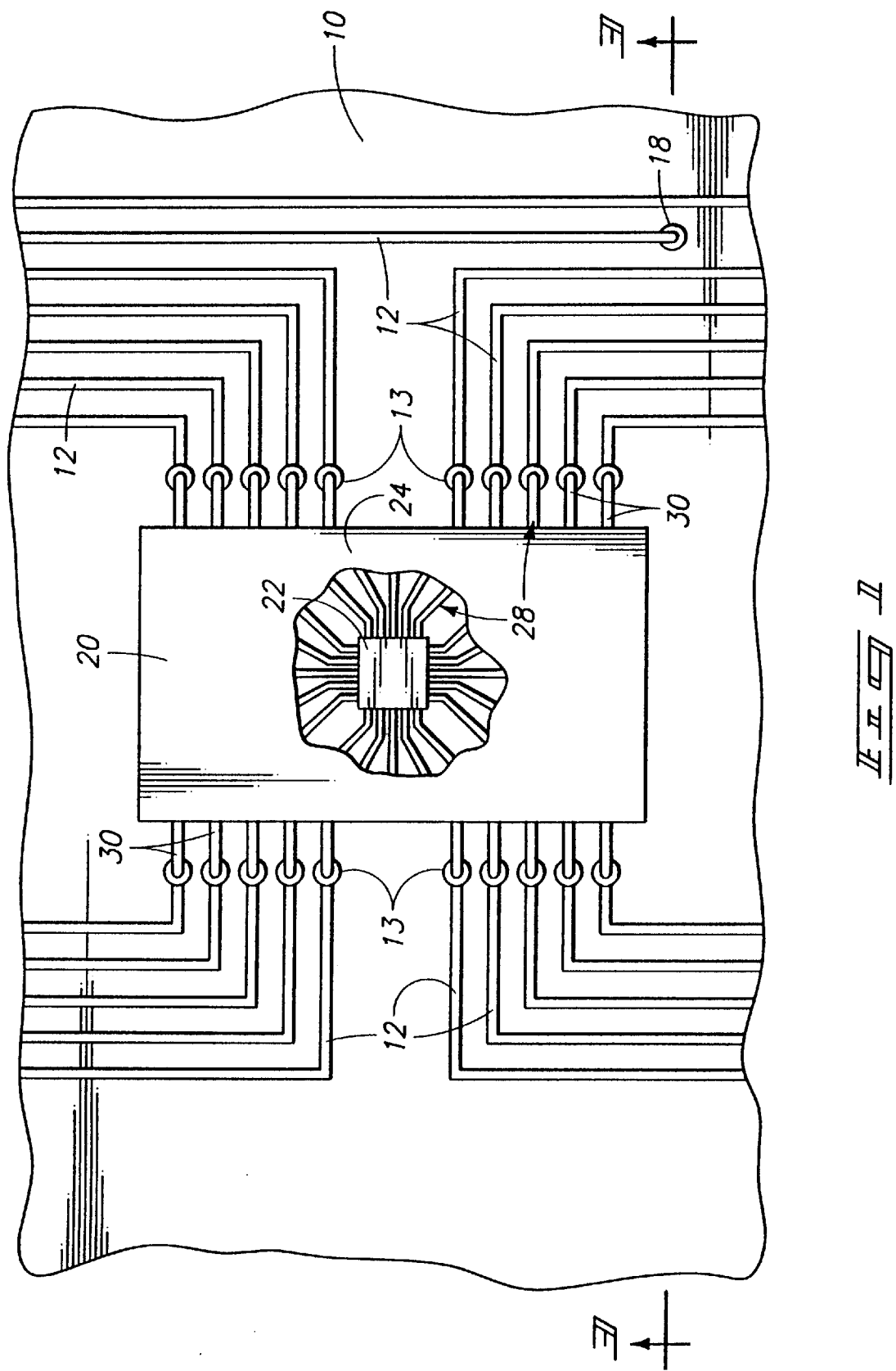
FIG. 1 is a top plan view of a portion of a PCB having an IC package mounted thereon.

This disclosure of the invention is submitted in furtherance of the constitutional purposes of the U.S. Patent Laws "to promote the progress of science and useful arts" (Article 1, Section 8).

According to one aspect, this invention encompasses a method for mounting an integrated circuit (IC) device onto a printed circuit board (PCB), the PCB having a plurality of bonding sites provided thereon, the IC device having a plurality of conductive bonding portions for electrically contacting corresponding bonding sites when the IC device is mounted to the PCB, the method comprising the following steps:

providing a PCB having an upper surface;

providing magnetic material within the IC device;

inducing a magnetic field of a selected strength at the surface of the PCB to hold the IC device onto the PCB; and soldering the conductive bonding portions to the corresponding bonding sites of the PCB while the IC device is held onto the PCB by the magnetic field.

According to another aspect, this invention defines a system for mounting an integrated circuit (IC) device onto a printed circuit board (PCB), the system comprising:

a PCB having a plurality of bonding sites and an upper surface;

an IC device having a plurality of conductive portions for electrically contacting corresponding bonding sites when the IC device is mounted to the PCB, a portion of the IC device being formed of a magnetic material; and field creating means for controllably inducing a magnetic field at the upper surface of the PCB, the magnetic field having a selected strength sufficient to hold the IC device onto the PCB.

FIG. 1 illustrates a portion of a printed circuit board (PCB) 10 having an integrated circuit (IC) device 20 mounted thereon. PCB 10 has multiple conductive traces 12 formed in a selected pattern to bus electronic signals across the board to and from IC device 20. Conductive traces 12 terminate on the surface of PCB 10 at bonding sites 13.

PCB 10 consists of multiple layers 14a–14c of insulative material such as paper bonded with phenolic resin or glass fibers bonded with epoxy resin (FIG. 3). The circuitry pattern of conductive traces can be provided on the upper surface of the PCB 10 (as shown in FIG. 1) or on intermediate layers as illustrated by traces 16 shown in FIG. 3. To access the circuitry provided on intermediate layers, "through-holes" are formed in the layers, as represented by through-hole 18. Conductive material fills through-hole 18 to join conductive traces 12 on the upper surface of PCB 10 to conductive traces 16 provided on intermediate layer 14b of PCB 10. Traces 12 and 16 are formed of a conductive material, such as copper.

According to one aspect of this invention, PCB 10 includes a layer 19 of magnetic material interspersed between two layers of the laminated PCB. Preferably, the magnetic material is a metal that is capable of being magnetized. For instance, layer 19 is preferably formed of iron, nickel, cobalt, mixtures thereof, or other materials composed at least partially of these metals. Alternatively, as a less preferred approach, the magnetic material has permanent magnet characteristics. This approach is less preferred because employing a permanent magnetic material may adversely affect normal operation of the PCB and IC devices thereon. Layer 19 is discussed below in more detail.

IC device 20 is illustrated as an IC package consisting of a semiconductor integrated circuit chip 22, a plastic casing 24 which encapsulates and protects IC chip 22, and a lead frame 28 which provides an electrical interconnection between IC chip 22 and traces 12 of PCB 10. Lead frame 28 has multiple conductive leads 30 which protrude from plastic casing 24 to electrically contact bonding sites 13 on PCB 10. As shown in FIG. 3, the conductive leads are "J"-shaped which is common for surface mounted IC packages.

IC device 20 is shown as an IC package for purposes of explanation. However, IC device 20 encompasses various other embodiments having IC chips and interconnecting bonding portions that contact the PCB bonding sites. For example, IC device 20 may consist of an unpackaged semiconductor integrated circuit chip having multiple conductive bonding pads (instead of leads) which mount directly to bonding sites on PCB 10. Additionally, the conductive leads need not be "J"-shaped, but can be straight (such as a dual in-line IC package) or have other geometries.

According to an aspect of this invention, the semiconductor IC chip 22 has a layer of magnetic material. As above, the magnetic material is preferably a metal that is capable of being magnetized (such as iron, nickel, or cobalt), or less preferably, a metal having permanent magnetic characteristics. As shown in the enlarged view of FIG. 2, a layer of magnetic material 32 is provided on top of IC chip 22. The layer of magnetic material is electrically isolated within the IC chip 22 by insulating materials that are within the purview of one of ordinary skill in the art. Here, layer 32 of magnetic material is spatially separated from pads 34 which are used to interconnect with lead frame 28. Although layer 32 is preferably provided on top of IC chip 22, layer 32 may be interwoven within the semiconductor structure.

According to another aspect of this invention, lead frame 28 is formed of a magnetic material.

According to this invention, IC devices are temporarily mounted onto PCBs using a magnetic coupling approach. With reference to FIG. 3, a magnetic field F of a selected strength is controllably induced or created by a field creating means at the upper surface of PCB 10. This magnetic field F attracts the magnetic material provided in IC device 20 (such as in lead frame 28 or in layer 32 of IC chip 22). The magnetic field has sufficient strength to hold IC device 20 onto PCB 10 at least temporarily until conductive leads 30 can be soldered to corresponding bonding sites 13 of the PCB. As shown in FIG. 1, IC device 20 is preferably held by the magnetic field in such a manner that conductive leads 30 are aligned with corresponding bonding sites 13. The field strength used to hold the ID devices onto the PCBs varies depending upon the distance between the field creating means and the ID devices and any material therebetween. More specifically, the magnetic field strength is inversely proportional to the distance between the ID devices and the PCBs.

According to one preferred embodiment of the field creating means, layer 19 of magnetic material is magnetized to create magnetic field F. The magnetic field flows into the metal provided in IC device 20 and turns the metal into a temporary magnet, whereby the magnetic layer 19 attracts the magnetic metal in IC device 20. According to an alternative embodiment of the field creating means, magnetic field F can be created by a magnetic source external to both PCB 10 and IC device 20. For example, an electromagnet could be provided beneath PCB 10 to induce a magnetic field of sufficient strength to hold IC device 20 onto PCB 10. This alternative embodiment is particularly useful if PCB 10 does not have a layer 19 of magnetic material which can be magnetized to attract IC device 20.

FIG. 4 diagrammatically illustrates a system for mounting an IC device onto a PCB. The system includes a mounting station 40, a testing station 50, and a soldering station 60. PCBs 41, 51, and 61 are shown at respective stations. The PCBs are moved in sequence through mounting station 40, testing station 50, and soldering station 60 by a conveyor mechanism, manually, or by some other apparatus. PCBs 41, 51, and 61 have the same structure as discussed above with respect to PCB 10 in that all three contain a layer of magnetic material. The layers of magnetic material within PCBs 41, 51, and 61 are selectively magnetized and demagnetized by magnet control system 70. Magnet control system 70 is electrically or magnetically coupled to the individual PCB layers of magnetic material, as is illustrated by intercoupling lines 72–74. According to this arrangement, magnetic control system 70 can independently magnetize or demagnetize any one of the PCBs without similarly magnetizing or demagnetizing the remaining PCBs.

At mounting station 40, individual IC devices 20 are transferred or moved from a supply location 42 to PCB 41 using a transfer mechanism 44. Transfer mechanism 44 preferably comprises a robotic arm 45 and a controller 46. Robotic arm 45 has a handling instrument 48 provided at the distal end thereof for contacting and handling individual IC devices 20. According to this invention, the handling instrument has an electromagnet provided therein with a relatively flat surface for contacting and mating with the relatively flat upper surfaces of IC devices 20. An electromagnet consists of a coil of wire wound around a magnetizable core, such as an iron core. When current flows through the coil, it creates a magnetic field having a strength dependent upon the amount of current fed through the coil. When current is stopped, the magnetic field ceases. Controller 46 is coupled to selectively activate and deactivate the electromagnet provided in handling instrument 48.

In operation, robotic arm 45 positions handling instrument 48 above an IC device 20 at supply location 42. Control system 46 activates the electromagnet in handling instrument 48 to induce a magnetic field which attracts and holds IC device 20 against the surface of handling instrument 48. Robotic arm 45 then moves IC device 20 to PCB 41 and aligns the conductive leads of IC device 20 with the corresponding bonding sites of PCB 41. Robotic arm 45 then places the conductive leads in contact with the corresponding bonding sites. Next, controller 46 deactivates the electromagnet in handling instrument 48 to eliminate the magnetic field and thereby release IC device 20 from handling instrument 48.

Magnet control system 70 magnetizes the layer of magnetic material within PCB 41 to induce a magnetic field at the upper surface of PCB 41. The magnetic field has a selected strength effective to hold IC devices 20 onto PCB 41. PCB 42 is then transferred to testing station 50, as represented by PCB 51, while the magnetic field is maintained.

At testing station 50, PCB 51 and IC devices 20 are tested to determine whether the completed board has any defects. Accordingly, another aspect of this invention relates to a method for testing an integrated circuit (IC) device and a printed circuit board (PCB), the PCB having a plurality of bonding sites provided thereon, the IC device having a plurality of conductive bonding portions for electrically contacting corresponding bonding sites when the IC device is mounted to the PCB, the method comprising the following steps:

inducing a magnetic field at the bonding sites of the PCB;

magnetically holding the conductive bonding portions of the IC device in electrical contact with the corresponding bonding sites of the PCB using the magnetic field; and testing the PCB and IC device while the IC device is being held onto the PCB by the magnetic field.

Testing station 50 has a testing unit 52 which evaluates the PCB and IC devices while the IC devices 20 are held onto PCB 51 by a magnetic field. The magnetic field is maintained at the surface of PCB 51 by magnet control system 70 from the time it was initiated at mounting station 40, during transfer from mounting station 40 to testing station 50, and during the evaluation period at testing station 50. Test unit 52 includes a probe 54 having multiple prongs 58 for contacting the edge connector of PCB 51 and imparting test signals to PCB 51 and IC devices 20, and a test controller 56 for controlling the testing patterns sent to PCB 51 and evaluating the data returned therefrom.

If the board tests positively, PCB 51 is transferred to soldering station 60, as represented by PCB 61, while the magnetic field is maintained. On the other hand, if the board fails any testing protocol, the inoperative components are identified and removed from the board.

This method of testing is advantageous over prior art techniques in that the IC devices 20 are temporarily held onto PCB 51 during testing by a magnetic coupling. The IC devices 20 have not yet been permanently soldered to the PCB. Accordingly, if a defect is discovered in one of the IC devices or in the PCB, the defective component can be removed and the remaining components recaptured for later use on other boards. This effectively eliminates the needless waste of discarding otherwise operable components that commonly occurs under conventional manufacturing and testing procedures.

According to another aspect, the invention also encompasses a method for testing a die wherein the die has circuitry provided on a semiconductor substrate. The method comprises the following steps: (1) magnetically holding the die in a selected orientation; (2) applying a testing device (such as a probe or test prongs) to the die; and (3) evaluating the die to determine whether the die is defective. The evaluation step might consist of transferring test data to and from the die through the testing device to ascertain whether the die is properly processing or storing the data.

At soldering station 60, a soldering unit 62 solders the conductive leads of IC devices 20 to corresponding bonding sites on PCB 61 while IC device 20 is held onto PCB 61 by a magnetic field. Soldering unit 62 comprises a solder applicator 64 and a solder controller 66. Magnetic control system 70 maintains the magnetic field at the surface of PCB 61 during its transfer from testing station 50 and at least the initial soldering process until the IC device is adequately secured to PCB 61. Thereafter, magnetic control system 70 ceases to create a magnetic field at the surface of PCB 61.

The above-preferred system includes a field creating means that induces a magnetic field at the surface of the PCBs by magnetizing layers of magnetic material provided within the PCBs. Alternatively, for PCBs that are constructed without these layers, the field creating means could consist of electromagnets are provided beneath the PCBs to selectively create a magnetic field, or cease to create a magnetic field, at the surface of the PCBs. In this alternative embodiment, magnet controller 70 would interface with such electromagnets to provide selective control of the magnetic fields. The electromagnets would be assigned to individual PCBs and carried with them through the various stations to insure that a magnetic field is maintained at mounting station 40, testing station 50, and soldering station 60.

The above process is provided in its preferred sequence of operation. However, certain steps may be conducted in a different order than described. For example, at mounting station 40, the magnetic field created by magnet control system 70 may be generated prior to deactivating the magnetic field induced by the electromagnet in handling instrument 48.

This invention is advantageous over prior art mounting techniques in that it eliminates the use of solder paste. Accordingly, the inefficient steps of positioning and aligning a screen and then applying soldering paste to the many bonding sites on the PCB are eliminated. Additionally, the mess associated with the application and cleaning of solder paste is also eliminated.

In compliance with the statute, the invention has been described in language more or less specific as to structural and methodical features. It is to be understood, however, that the invention is not limited to the specific features described and shown, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for mounting an integrated circuit onto a printed circuit board, the printed circuit board having a plurality of bonding sites, the integrated circuit having a plurality of conductive bonding portions arranged to electrically contact corresponding bonding sites when the integrated circuit is mounted to the printed circuit board, the method comprising:

providing a printed circuit board having an upper surface;

providing magnetic material within the integrated circuit;

inducing a magnetic field at the upper surface of the printed circuit board to hold the integrated circuit onto the printed circuit board with the conductive portions of the integrated circuit in alignment with the corresponding bonding sites;

testing the printed circuit board and integrated circuit while the integrated circuit is being held onto the printed circuit board by the magnetic field; and fixing the conductive bonding portions to the corresponding bonding sites of the printed circuit board while the integrated circuit is held onto the printed circuit board by the magnetic field.

2. A method for mounting an integrated circuit onto a printed circuit board according to claim 1 and further comprising providing a layer of magnetic material within the integrated circuit, and wherein the integrated circuit has a plurality of conductive bonding pads defining the conductive bonding portions.

3. A method for mounting an integrated circuit onto a printed circuit board according to claim 1 wherein the integrated circuit comprises a package including a chip encapsulated in a casing and a lead frame electrically coupled to the chip, the lead frame having a plurality of conductive leads which form the conductive bonding portions and further comprising forming the lead frame of a magnetic material.

4. A method for mounting an integrated circuit onto a printed circuit board according to claim 1 wherein the magnetic material is selected from a group consisting of iron, nickel, and cobalt.

5. A method for mounting an integrated circuit onto a printed circuit board according to claim 1 and further comprising providing a layer of magnetic material in the printed circuit board, and magnetically charging the printed circuit board layer to attract the magnetic material in the integrated circuit and to hold the integrated circuit onto the printed circuit board.

6. A method for mounting an integrated circuit onto a printed circuit board, the printed circuit board having a plurality of bonding sites, the integrated circuit having a plurality of conductive bonding portions for electrically contacting corresponding bonding sites when the integrated circuit is mounted to the printed circuit board, the method comprising:

providing a printed circuit board having an upper surface;

providing magnetic material within the integrated circuit;

positioning the integrated circuit relative to the printed circuit board with the conductive portions of the integrated circuit aligned with and contacting the corresponding bonding sites of the printed circuit board;

inducing a magnetic field of a selected strength at the surface of the printed circuit board to hold the integrated circuit onto the printed circuit board;

testing the printed circuit board and integrated circuit while the integrated circuit is being held onto the printed circuit board by the magnetic field; and soldering the conductive portions to the corresponding bonding sites of the printed circuit board while the integrated circuit is held onto the printed circuit board by the magnetic field.

7. A method for mounting an integrated circuit onto a printed circuit board according to claim 6 and further comprising providing a layer of magnetic material within the chip, and wherein the integrated circuit comprises a chip having a plurality of bonding pads which form the conductive bonding portions.

8. A method for mounting an integrated circuit onto a printed circuit board according to claim 6 wherein the integrated circuit comprises a chip encapsulated in a casing and a lead frame electrically coupled to the chip, the lead frame having a plurality of conductive leads which form the conductive bonding portions, the method further comprising forming the lead frame of a magnetic material.

9. A method for mounting an integrated circuit onto a printed circuit board according to claim 6 and further comprising providing a layer of magnetic material in the printed circuit board, and magnetically charging the layer to attract the magnetic material in the integrated circuit and to hold the integrated circuit onto the printed circuit board.

10. A method for mounting an integrated circuit onto a printed circuit board according to claim 6 and further comprising moving the integrated circuit using a transfer mechanism having a handling instrument, the handling instrument having a surface, creating a magnetic field to attract the integrated circuit to the surface of the handling instrument, maintaining the magnetic field to transfer the integrated circuit to the printed circuit board and to align the conductive portions with the bonding sites, and ceasing to create the magnetic field after the conductive portions are aligned with the bonding sites.

11. A method for mounting an integrated circuit onto a printed circuit board according to claim 6 and further comprising providing a layer of magnetic material in the printed circuit board, moving the integrated circuit using a transfer mechanism having a handling instrument, the handling instrument having a surface, creating a magnetic field to attract the integrated circuit to the surface of the handling instrument, maintaining the magnetic field to transfer the integrated circuit to the printed circuit board and to align the conductive portions with the bonding sites, ceasing to create the magnetic field after the conductive portions are aligned with the bonding sites, and magnetically charging the layer to attract the magnetic material in the integrated circuit and to hold the integrated circuit onto the printed circuit board.

* * * * *